United States Patent
Miura et al.

(10) Patent No.: US 6,815,231 B2
(45) Date of Patent: Nov. 9, 2004

(54) METHOD OF TESTING AND MANUFACTURING NONVOLATILE SEMICONDUCTOR MEMORY

(75) Inventors: Akemi Miura, Koshigaya (JP); Hitoshi Kume, Musashino (JP); Toshiaki Nishimoto, Tama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/163,294

(22) Filed: Jun. 7, 2002

(65) Prior Publication Data

US 2002/0187602 A1 Dec. 12, 2002

(30) Foreign Application Priority Data

Jun. 11, 2001 (JP) ........................................ 2001-174976

(51) Int. Cl.[7] .............................................. H01L 21/00
(52) U.S. Cl. ......................................................... 438/14
(58) Field of Search ..................... 438/14, 18; 714/723; 371/21.1; 757/620

(56) References Cited

U.S. PATENT DOCUMENTS

| | | | | |
|---|---|---|---|---|
| 5,504,369 A | * | 4/1996 | Dasse et al. ................. | 257/620 |
| 5,724,365 A | * | 3/1998 | Hsia et al. ................... | 714/718 |
| 6,055,655 A | * | 4/2000 | Momohara ................... | 714/723 |
| 6,198,657 B1 | * | 3/2001 | Uekubo et al. ......... | 365/185.04 |
| 6,400,173 B1 | * | 6/2002 | Shimizu et al. ............. | 324/765 |
| 6,445,617 B1 | * | 9/2002 | Sakakibara ............ | 365/185.22 |

FOREIGN PATENT DOCUMENTS

| | | |
|---|---|---|
| JP | 9-35500 | 2/1997 |
| JP | 9-320299 | 12/1997 |

* cited by examiner

Primary Examiner—W. David Coleman
(74) Attorney, Agent, or Firm—Miles & Stockbridge P.C.

(57) ABSTRACT

A simple and easy method for exercising quality control over memory cell inter-layer dielectric film within a short period of time, using a memory array or single memory formed in the scribe area, without stressing nonvolatile semiconductor memory cells and a method of manufacturing a nonvolatile semiconductor memory device; whereby a single nonvolatile memory is formed in an area other than a chip area on a semiconductor wafer and used after completion of a wafer manufacturing process to perform an inter-layer dielectric film quality control process for evaluating the write saturation characteristic, cut out nondefective chips only, and conduct a plastic molding process, achieving an increased yield after chip cutting.

6 Claims, 15 Drawing Sheets

F I G. 9
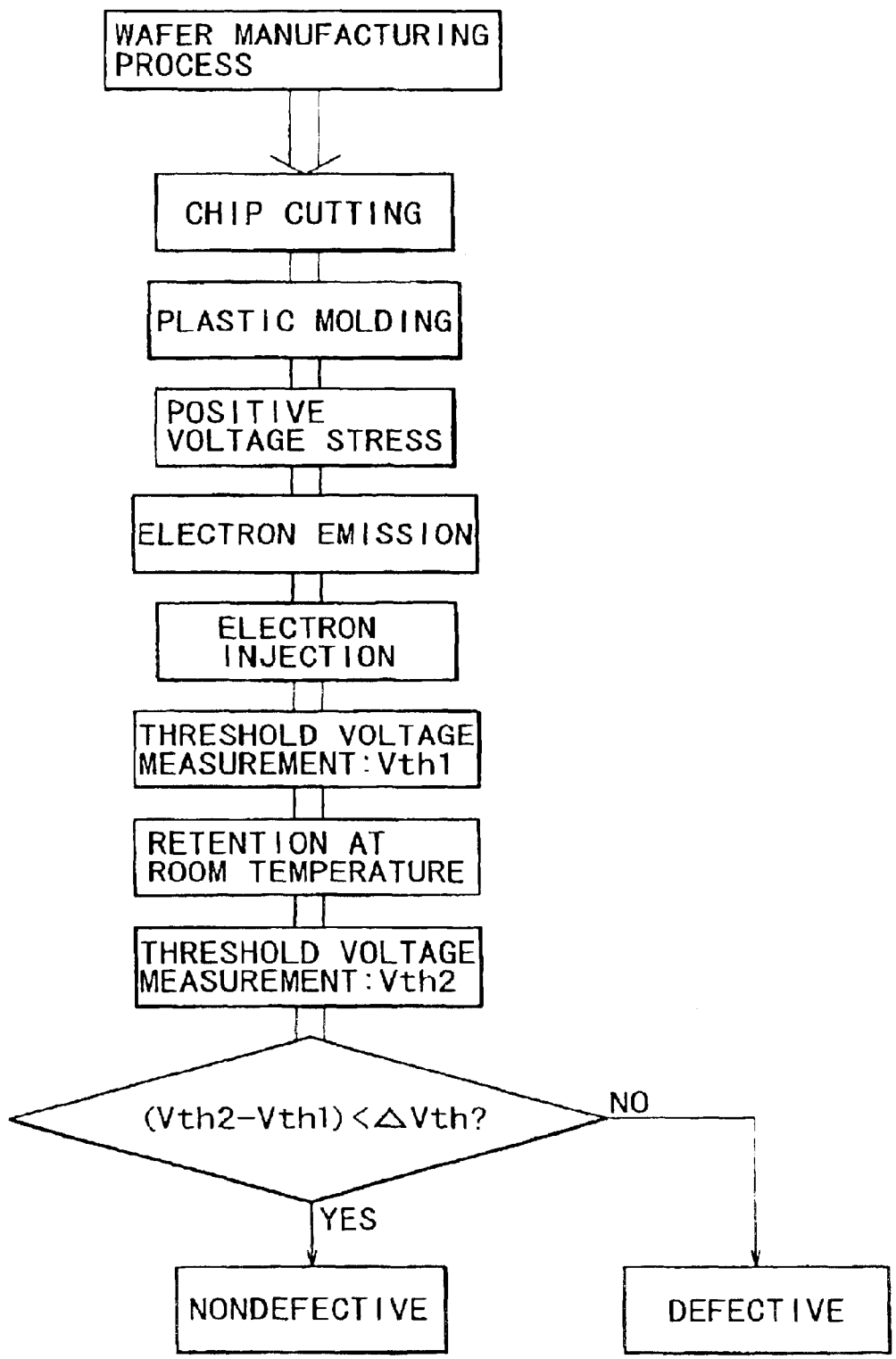

METHOD OF TESTING AND MANUFACTURING NONVOLATILE SEMICONDUCTOR MEMORY

BACKGROUND OF THE INVENTION

1. Field of the Invention

The present invention relates to a method of manufacturing a semiconductor nonvolatile memory, and more particularly to the inter-layer dielectric film QC (quality control), inter-layer dielectric screening, and manufacturing methods for a nonvolatile semiconductor memory whose memory cell has a double-layer gate structure comprising a floating gate and control gate.

2. Description of Related Art

The nonvolatile semiconductor memory controls the amount of electrical charge stored in a floating-gate electrode by injecting/emitting electrons via a tunnel oxide. If, for some reason, electrons leave the floating-gate electrode, positioning the threshold value distribution outside a predetermined range, the affected product is judged to be defective. This defect is called a retention failure. FIG. 11 shows a cross-sectional view of the nonvolatile semiconductor memory. Electrons leave via either a tunnel oxide 2 or an inter-layer dielectric 5 that is accumulated between a floating-gate electrode 4 and control-gate electrode 6. The retention failure can be roughly divided into two types: initial failure and failure after a rewrite. As shown in FIG. 12, simple capacitors are usually formed in scribe areas or other different positions on the same wafer used for chip manufacture. The simple capacitors formed in this manner make it possible to evaluate the tunnel oxide and inter-layer dielectric separately. As regards an initial failure, a breakdown voltage test is conventionally conducted to measure the gate oxide breakdown voltage Vg when the capacitors are formed or when all processes are completed. When the breakdown voltage measured in the breakdown voltage testing is higher than the reference breakdown voltage Vgref1, the subsequent processes (chip cutting, plastic molding, and screening) are performed to initiate product shipment. The breakdown voltage is measured at one or more locations. If the breakdown voltage is not measured at all locations, it is measured, for instance, at some nonadjacent upper/lower/left/right locations (A, B, C, D, and E in FIG. 12). The number of measurements to be taken is not limited.

The flowchart in FIG. 13 describes a conventional QC method (quality control method) for a tunnel oxide and inter-layer dielectric. After a wafer passes an initial failure inspection, it is sliced into chips and then sealed into a package. FIG. 14 schematically shows the result of an electrical charge retention test conducted with a manufactured chip. In this test, the same rewrite stress as for an actual operation is applied to a packaged manufactured chip to temporarily emit electrons from the floating-gate electrode, electrons are then injected again from the substrate into the floating-gate electrode until a certain threshold value is reached, and the phenomenon during which electrons left the floating-gate electrode is observed. For acceleration of this phenomenon, the testing setup may occasionally be left at a high temperature. When the chip under test is normal, the threshold value distribution either suffers nonrotational displacement or remains virtually still. However, actual products have a large number of memories. Therefore, they turn out to be defective due to a threshold voltage drop even when a large number of electrons leave a limited number of cells for some reason or other.

Although the testing/evaluation methods for measuring the threshold voltage of a nonvolatile semiconductor memory were disclosed by JP-A No. 35500/1997, which was laid open on Feb. 7, 1997, and JP-A No. 320299/1997, which was laid open on Feb. 12, 1997, these inventions both evaluated the tunnel oxide film quality.

For capacitor-based measurements, there was no conventional quantitative guide for linking a tail bit-failure to a dielectric strength decrease, and no retention test was conducted on a product level after a rewrite operation was performed a number of times stated in the warranty. Further, the cost depended on the yield prevailing after packaging of sliced chips. As regards initial failures, therefore, a nondetectable nonequilibrium tail bit-failure particularly defeated the attempt to reduce the cost.

SUMMARY OF THE INVENTION

Accordingly, the object of the present invention is to provide a method of manufacturing a semiconductor device carrying a nonvolatile semiconductor memory through a process that rapidly and easily selects products exhibiting long-term reliability of inter-layer dielectrics while conducting an inspection with a single memory cell or memory array formed in a scribe area without stressing any memory cell.

For nonvolatile semiconductor memories, scaling of a tunnel oxide (2 in FIG. 11) and inter-layer dielectric (5 in FIG. 11) or the increase in the operating voltage is particularly effective for raising the write speed. It is therefore important to immediately solve reliability problems that arise as a secondary effect. Under these circumstances, the inventors studied cases where inter-layer dielectric scaling and operating voltage increase were effected. In consideration of tunnel injection from a substrate, FIG. 16 shows the relationship among inter-layer dielectric field strength, tunnel oxide film thickness, and inter-layer dielectric film thickness. As preconditions, the memory gate length and width, the voltage applied to the control-gate electrode (A in FIG. 16), the memory intrinsic threshold voltage, and the memory threshold voltage were rendered constant. If, for instance, the tunnel oxide film thickness is 10 nm, the inter-layer dielectric field strength is 6.3 MV/cm when the inter-layer dielectric film thickness is 15.5 nm. However, when scaling is conducted to reduce the inter-layer dielectric film thickness to 12.5 nm, the inter-layer dielectric field strength increases to 7.3 MV/cm. Even when tunnel oxide film thickness scaling is conducted, the same result is obtained as in the case of inter-layer dielectric scaling. For inter-layer dielectric film thickness scaling, therefore, it is obvious that the guide for the permissible inter-layer dielectric field strength is important from the viewpoint of reliability. As regards the voltage to be applied to the control-gate electrode, B in FIG. 16 shows the result of a study that was conducted on a case where the voltage was raised by 1 V for operating speed increase when the tunnel oxide film thickness was 8.5 nm. The result indicates that the inter-layer dielectric field strength was increased by about 0.25 mV/cm no matter what the inter-layer dielectric film thickness was.

FIG. 17 shows the result of a study that was conducted to determine the relationship among inter-layer dielectric field strength (absolute value), tunnel oxide film thickness, and inter-layer dielectric film thickness in cases where a tunnel current was used to emit electrons from the floating-gate electrode to the substrate. As the preconditions, the memory gate length and width, the voltage applied to the control-gate electrode (A in FIG. 17), the memory intrinsic threshold voltage, and the memory threshold voltage prevailing after electron emission were rendered constant. The voltage applied to the control-gate electrode was lowered by 1 V for analysis. The result of the analysis is indicated by B in FIG. 17. Even in situations where the threshold voltage was set to a fixed value smaller than the intrinsic threshold voltage value, it was found that scaling of the tunnel oxide and inter-layer dielectric increased the inter-layer dielectric field strength when electrons were emitted from the control-gate electrode. The above findings indicate that tunnel oxide/inter-layer dielectric scaling and operating voltage increase tend to increase the inter-layer dielectric field strength. It is therefore obvious that inter-layer dielectric film quality assurance is an important task to be carried out from now on.

The evaluation method based on the correlation between the threshold voltage (hereinafter referred to as the saturated threshold voltage), which is observed when the electron injection IFTO from substrate (FIG. 19) and the current leakage IONON from floating gate to inter-layer dielectric are balanced, and the threshold voltage decrease after retention in a saturated state is incorporated into a method of manufacturing a nonvolatile semiconductor memory. In other words, after determination of circuitry, device structure, and process, a wafer based on the process is manufactured, and then the critical threshold voltage for screening is determined in accordance with the saturated threshold voltage characteristic derived from electron injection/emission and the threshold voltage decrease after retention of predetermined duration (FIG. 4). Subsequently, the saturated threshold voltage of each wafer is measured. Wafers whose measurements are greater than the critical threshold voltage for screening are removed from the production line. The remaining wafers are subjected to a probe inspection process, chip cutting process, and plastic molding process to sort out nondefective articles for semiconductor device manufacturing purposes (FIG. 5).

The evaluation method is detailed below, beginning with its physical phenomena. In a nonvolatile semiconductor memory, electrons are accumulated at the floating-gate electrode by means of tunnel injection from substrate. The larger the amount of electrical charge accumulated in the floating-gate electrode, the higher the memory threshold voltage. On the other hand, if a positive voltage is applied to the control electrode, the amount of electrical charge in the floating-gate electrode increases and the electric field applied to the inter-layer dielectric increases in strength. Therefore, the threshold voltage increases and the inter-layer dielectric leak current becomes insignificant. When the tunnel current injected into the floating-gate electrode via the tunnel oxide and the leakage into the control-gate electrode via the inter-layer dielectric are balanced, the memory threshold voltage reaches a certain saturation value (saturated threshold voltage). The saturated threshold voltage varies with the degree of inter-layer dielectric leakage. Therefore, the degree of inter-layer dielectric leakage can be discussed by noting the changes in the saturated threshold voltage while the write (erase) conditions are fixed. FIG. 18 shows the result of the analysis of inter-layer dielectric leak current and inter-layer dielectric field strength, which was conducted to study the relationship between the changes in the saturated threshold voltage and the degree of inter-layer dielectric leakage. This analysis was made on the basis of the fact that the tunnel current is equal to the inter-layer dielectric current when the saturated threshold voltage is obtained. The result of this study indicates that an increase in the absolute value of the voltage applied to the control-gate electrode causes an increase in the inter-layer dielectric leak current when the saturated threshold voltage is constant, and that an increase in the saturated threshold voltage causes a decrease in the inter-layer dielectric leak current when the applied voltage is constant. Therefore, the degree of inter-layer dielectric leakage can be monitored by observing how the memory threshold voltage changes upon pulse application while the applied voltage is maintained constant. More specifically, it is possible to conclude that no defect results from inter-layer dielectric leakage when the saturated threshold voltage is higher than a certain level.

Although the above explanation is based on an example in which a write operation is performed by means of injection from substrate, it goes without saying that the same method can also be applied in cases where an erase operation is performed by means of injection from substrate.

Although the above explanation is based on an example in which an operation is performed to achieve injection from substrate, the same method is also applicable to cases where an operation is performed to achieve emission from the floating gate to the substrate. More specifically, if a negative high voltage is applied to the control-gate electrode when electrons are transferred from the floating-gate electrode to the substrate, the memory threshold voltage decreases in a negative direction from its intrinsic threshold level (threshold voltage stabilized by adequate ultraviolet radiation). As a result, the lower the threshold voltage, the greater the inter-layer dielectric field strength. In this type of operation, due attention needs to be paid to the inter-layer dielectric field to be applied at the time of electron emission. It is therefore possible to conclude that the degree of inter-layer dielectric leakage is small if the prevailing memory threshold voltage is increased in a negative direction from its intrinsic threshold level while the voltage applied to the control-gate electrode and the duration of pulse application are maintained constant.

Other and further objects, features and advantages of the invention will appear more fully from the following description.

BRIEF DESCRIPTION OF THE DRAWINGS

In the attached drawings:

FIG. 9 is a flowchart of an inter-layer dielectric screening method 1 of the present invention, which is applied on an individual chip basis.

DETAILED DESCRIPTION OF THE PREFERRED EMBODIMENTS

Figure 11:
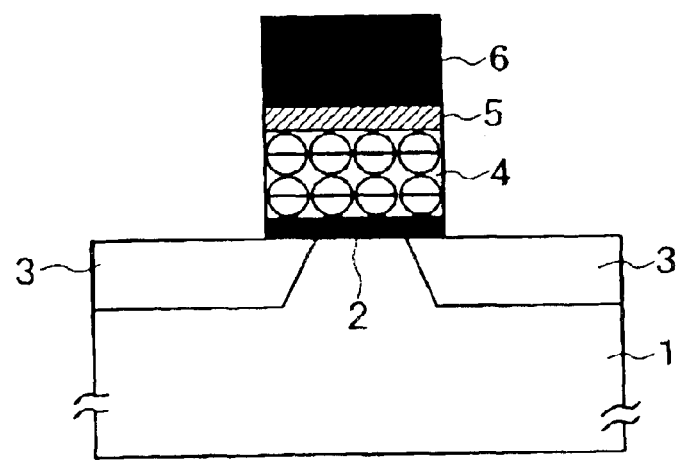
FIG. 11 is a diagram showing the cross section of a nonvolatile semiconductor memory.

First of all, the nonvolatile semiconductor memory of the present invention is explained here. FIG. 11 shows the memory cell cross-sectional view of the nonvolatile semiconductor memory. When N-type impurity (As) ions are injected, an N-type diffusion layer 3 is formed on a P-type substrate 1. The resultant structure consists of a first insulation layer (tunnel oxide) 2, second insulation layer (inter-layer dielectric) 5, floating-gate electrode 4, and control-gate electrode 6. The first insulation layer is formed by an oxide film consisting of $SiO_2$. The second insulation layer is formed by a film stack consisting of $Si_3N_4$ and $SiO_2$. The floating-gate electrode layer 4 and control-gate electrode layer 6 are made of polycrystal polysilicone. The LDD structure for N− ion injection or the pocket structure for P+ ion injection may be employed to reduce the electric concentration of a source/drain region although it is not indicated in the figure. Wafers incorporating a nonvolatile memory are manufactured by sequentially performing a well formation process, gate formation process, source/drain formation process, wiring process, and passivation layer deposition process. Unlike the other memories such as SRAMs and DRAMs, the tunnel oxide, floating-gate electrode, inter-layer dielectric, and control-gate electrode are sequentially formed on a semiconductor substrate surface during the gate formation process. The wafer manufacturing process is a series of the above processes.

Figure 3:
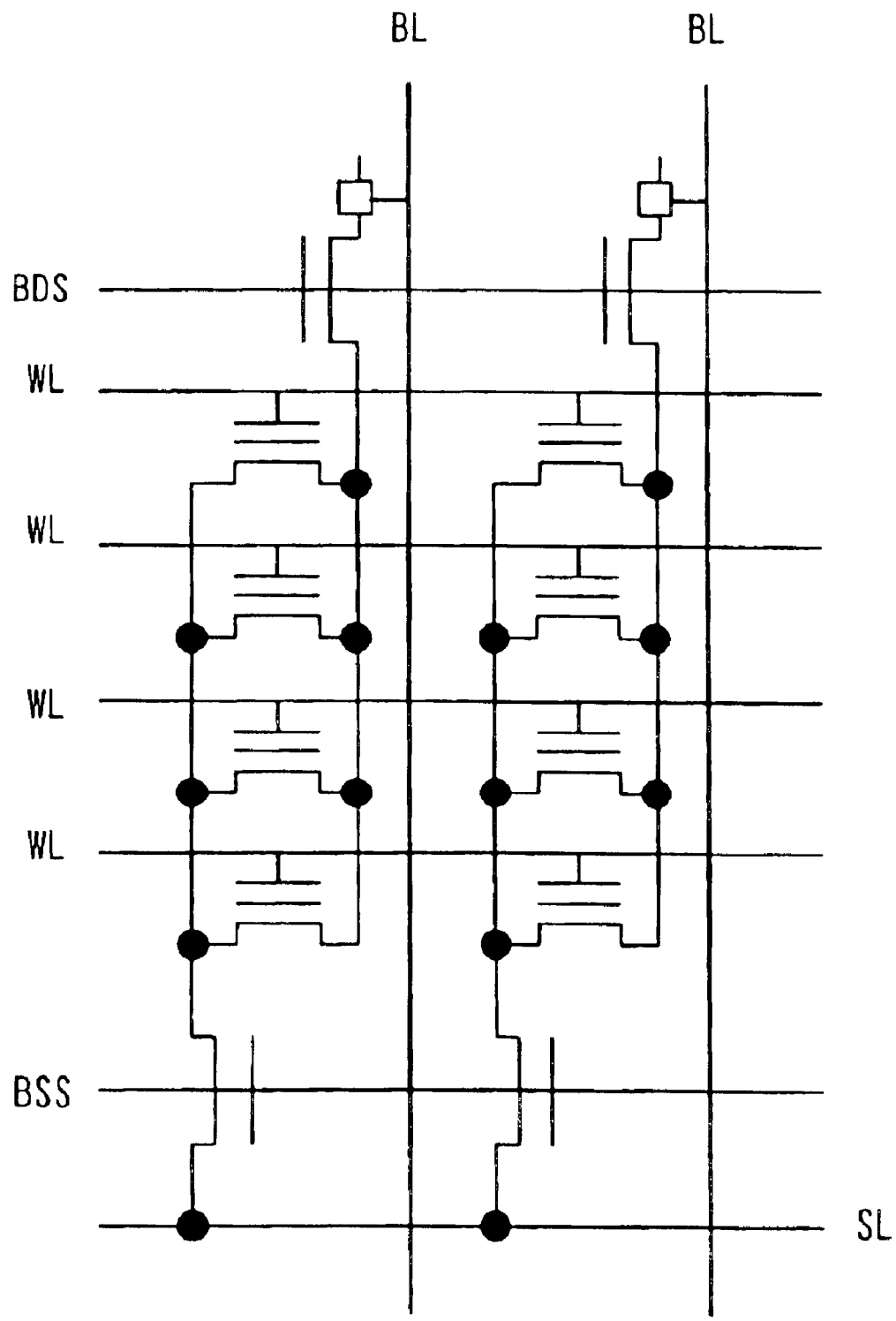
FIG. 3 is an equivalent circuit figure of an AND flash memory array.

FIG. 3 shows the equivalent circuit figure of an AND flash memory array. As shown in the figure, AND flash memories are parallel-connected between the array's bit line and source line. In the employed structure, therefore, low threshold voltage bits in the array determine the variation in the product's threshold voltage distribution. When a write operation is performed, a positive high voltage is applied to the word line of the selected bit to invoke electron injection from the substrate. When an erase operation is performed, a negative voltage is used to achieve electron emission on an individual word line basis. In this manner, actual memory operations are performed to invoke both the electron injection from substrate and electron emission from floating-gate electrode. When an electrical stress test is performed for inter-layer dielectric film quality control purposes, inter-layer dielectric degradation is accelerated either by applying a positive high voltage while the memory threshold voltage is high or by applying a negative high voltage while the memory threshold voltage is low. When the former method is used, the inter-layer dielectric is degraded by continuous substrate injection so that the memory threshold voltage reaches a certain saturation level when the "current injection from substrate=inter-layer dielectric leakage" condition is met; therefore, the memory threshold voltage will not be raised by continuous pulse application. When the latter method is used, the inter-layer dielectric is degraded by continuous electron emission to substrate so that the memory threshold voltage reaches a certain saturation level when the "current emission to substrate=inter-layer dielectric leakage" condition is met; therefore, the memory threshold voltage will not be lowered by pulse application. The description given below as an example deals with the degradation that may be incurred by write operations for injecting electrons from the substrate in situations where 100,000 rewrite cycles are warranted.

Figure 1:
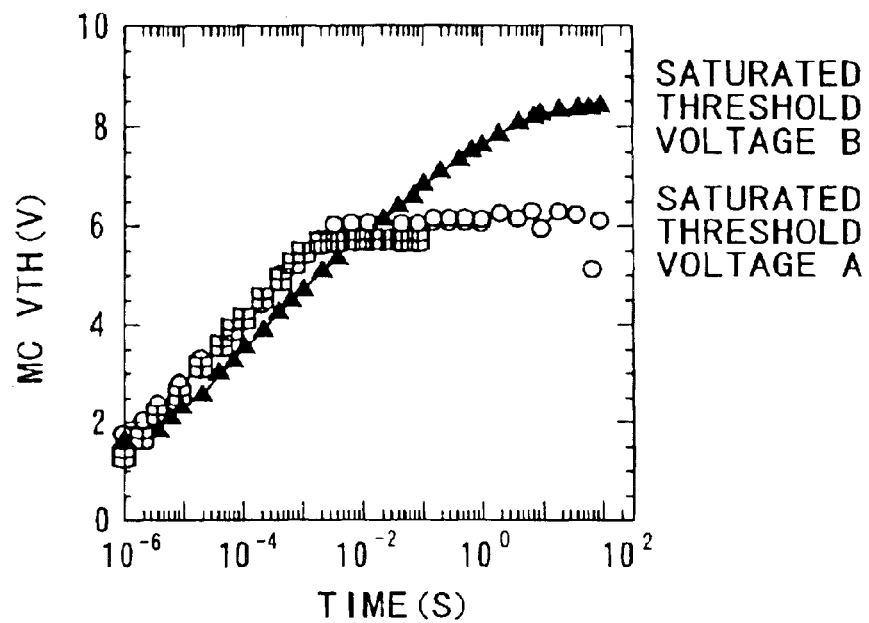
FIG. 1 shows the write (erase) characteristic of a nonvolatile semiconductor memory array.

FIG. 1 shows the memory's write characteristic that explains the inter-layer dielectric film quality control method of the present invention. When substrate injection is effected by an erase operation, the following discussion holds true if the term "write" is read as "erase". In an actual product, a write (erase) operation is completed in less than several milliseconds. For the purpose of determining how inter-layer dielectric leakage affects the memory threshold voltage, however, pulse application is continued without performing an erase (write) operation until the saturated threshold voltage is measured. The upper limit on the pulse application time can be determined by multiplying the time required for a write by the write (erase) slowest bit by the warranted rewrite cycle count. If, for instance, the slowest bit's write time is 1 ms, the maximum permissible pulse application time is 1 ms×100,000=100 s. If memory threshold voltages B and A are compared as indicated in FIG. 1 when the pulse application time 100 seconds, B>A. It can therefore be concluded that the amount of inter-layer dielectric leakage is smaller in B. For inter-layer dielectric leakage level determination based on the memory threshold voltage level, therefore, it is necessary to check whether the saturated threshold voltage is obtained when continuous write operations are performed in consideration of actual operations and check whether the threshold voltage decreases when the threshold voltage obtained by continuous pulse application for continuous write operations is retained. In the currently used example, in which it means that inter-layer dielectric leakage has occurred if the saturated threshold voltage is obtained upon completion of a 100-second continuous write operation, it is possible to conclude that the resulting product is highly likely to be defective. An indoor retention test was started at the threshold voltage obtained by continuous pulse application for continuous write operations with a view toward investigating the tolerance on inter-layer dielectric leakage, including cases where the saturated threshold voltage was attained (inter-layer dielectric film quality control method 1).

Figure 2:
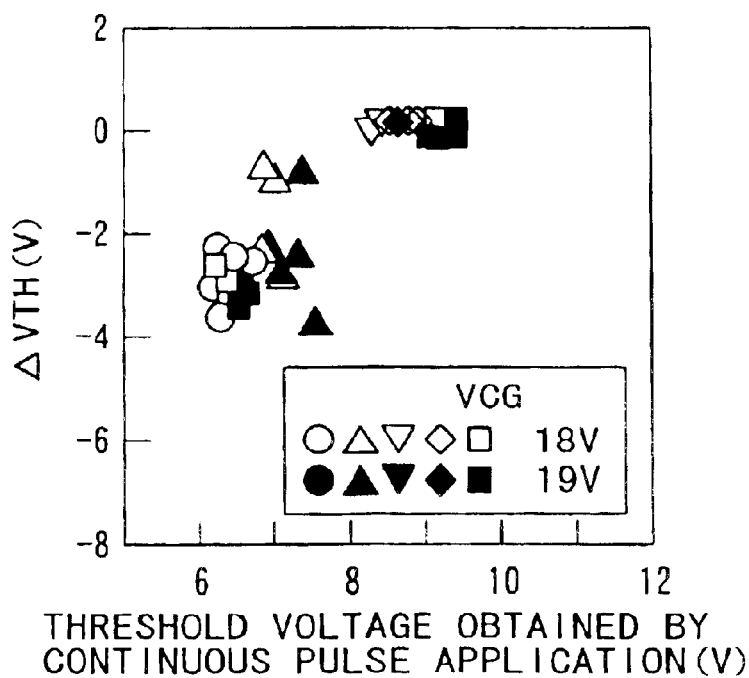
FIG. 2 shows the retention characteristic of a nonvolatile semiconductor memory array.

FIG. 2 shows the results of investigation. In an actual AND flash memory, cells are parallel-connected so that low threshold voltage cells are detected as tail bit-failures. To facilitate the detection of low threshold voltage cells that may cause inter-layer dielectric leakage, a parallel-connected, all-selection 32 kb memory array, which was formed in the scribe area by the same process as for the product, was used. In general, the flash memory write (erase) characteristic is such that the pulse application time required for predetermined memory threshold voltage buildup changes by about one order of magnitude when the write (erase) voltage changes by 1 V. To determine the saturated threshold voltage difference from the results shown in FIG. 1, voltages of 18 V and 19 V were applied for 100 seconds and 10 seconds, respectively, and memory arrays differing in process conditions were used. The horizontal axis shows the threshold voltage obtained by continuous pulse application for continuous write (erase) operations. The vertical axis shows how the memory threshold voltage varied from the threshold voltage obtained by continuous pulse application after one-day retention at room temperature. The obtained results indicate that a memory array whose threshold voltage obtained by continuous pulse application is lower than 8 V contains cells invoking a threshold voltage decrease, which causes inter-layer dielectric leakage. As indicated by B in FIG. 1, a case where the threshold voltage obtained by continuous pulse application is higher than 8 V when 18 V is applied for 100 seconds corresponds to a case where the memory has not obtained the saturated threshold voltage during a continuous write operation. It means that the inter-layer dielectric leakage is smaller than the current injection from the substrate. This relationship is still maintained after a 1 V increase in the write (erase) voltage setting. Therefore, a voltage is applied to the control-gate electrode in a DC manner for the period of time that is determined by multiplying the actual write (erase) time by the product's warranted rewrite cycle count. The lower limit (critical threshold voltage for screening) on the memory threshold voltage obtained by continuous pulse application for this method can be determined from the relationship between the threshold voltage obtained upon stress application and the retention test. As regards the example used for investigation, it can be concluded, with device variations taken into account, that the probability of tail bit-failure occurrence, which can be caused by inter-layer dielectric leakage, is extremely low as far as the threshold voltage obtained by continuous pulse application is 8.5 V or higher under the "18 V–100 sec" condition. The lower limit for deciding on the memory threshold voltage obtained by continuous pulse application is determined according, for instance, to circuit operation margin and process variation margin.

The employed application voltage and pulse application time values are appropriately determined in accordance with actual memory structure constants and not unique. Testing can be conducted not only with a memory array but also with an independent memory cell formed in the scribe area. When the inter-layer dielectric film quality control method is applied, an independent memory is rather used. For evaluation time reduction purposes, an increased efficiency can be provided by using an application voltage that is higher than the operating voltage.

Figure 4:
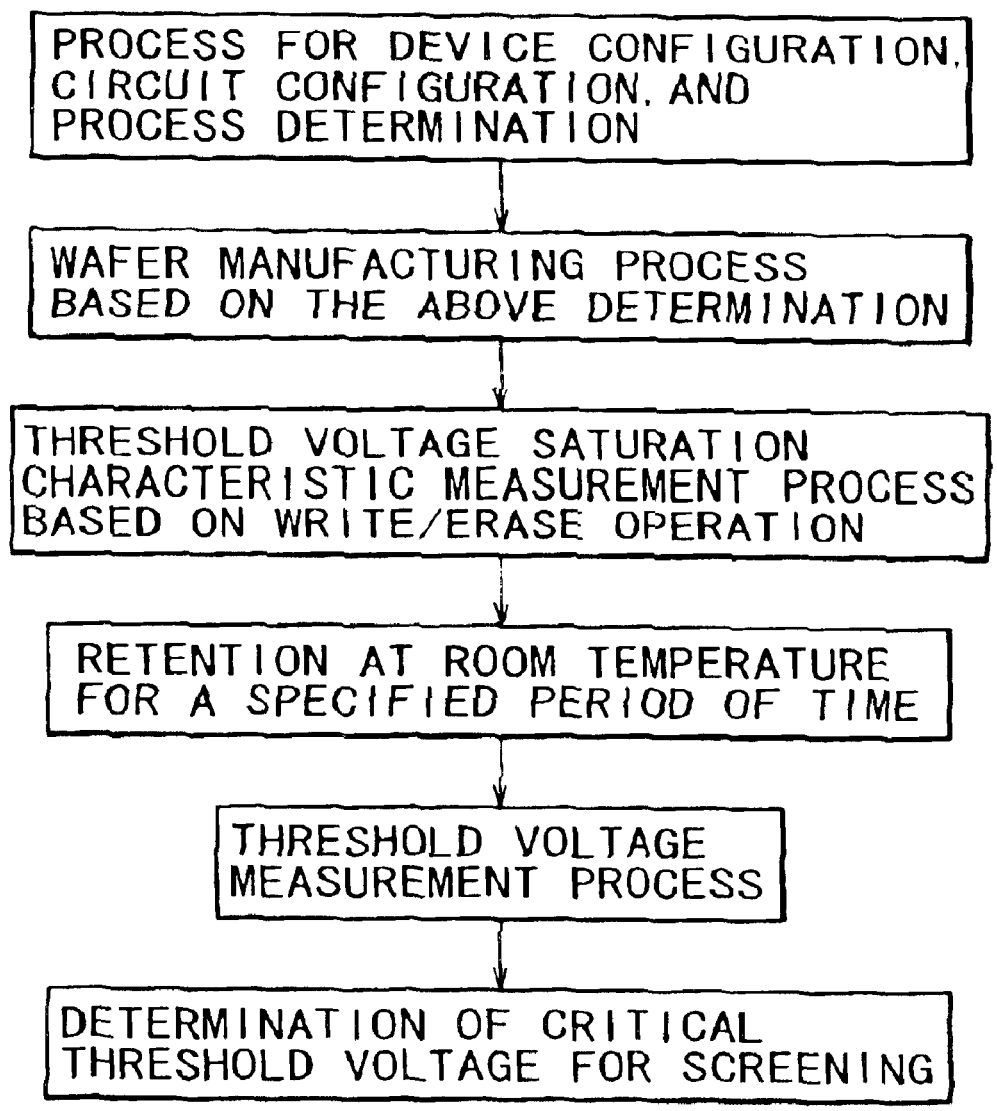
FIG. 4 is a flowchart of a nonvolatile semiconductor device manufacturing method to which the inter-layer dielectric film QC (quality control) method of the present invention is applied.

FIG. 4 is a flowchart showing a process for determining the critical threshold voltage for screening, which should be attained and is required for applying the inter-layer dielectric film quality control method of the present invention to a volume production line.

After device/circuit configuration and process determination, the semiconductor memory based on the above process is produced on a wafer. The processes to be performed for wafer manufacturing are as stated earlier. Subsequently, write or erase operations are performed to measure the threshold value saturation characteristic. More specifically, the threshold value representing a saturation stage shown in FIG. 1 is obtained by means of continuous pulse application. When continuous pulse application is conducted, the threshold value derived from electron injection from the substrate (write operation) is greater than the intrinsic threshold voltage value and the threshold value derived from electron emission to the substrate (erase operation) is smaller than the intrinsic threshold voltage value. The next step is to determine the threshold value or its decrease after indoor retention for a predetermined period of time. The above measurement needs to be taken at multiple points on the wafer because of the necessity for correlation determination. When the above measured data is obtained (FIG. 2), the threshold value for quality assurance of the inter-layer dielectric on wafer (critical threshold voltage for screening) can be determined.

Figure 5:
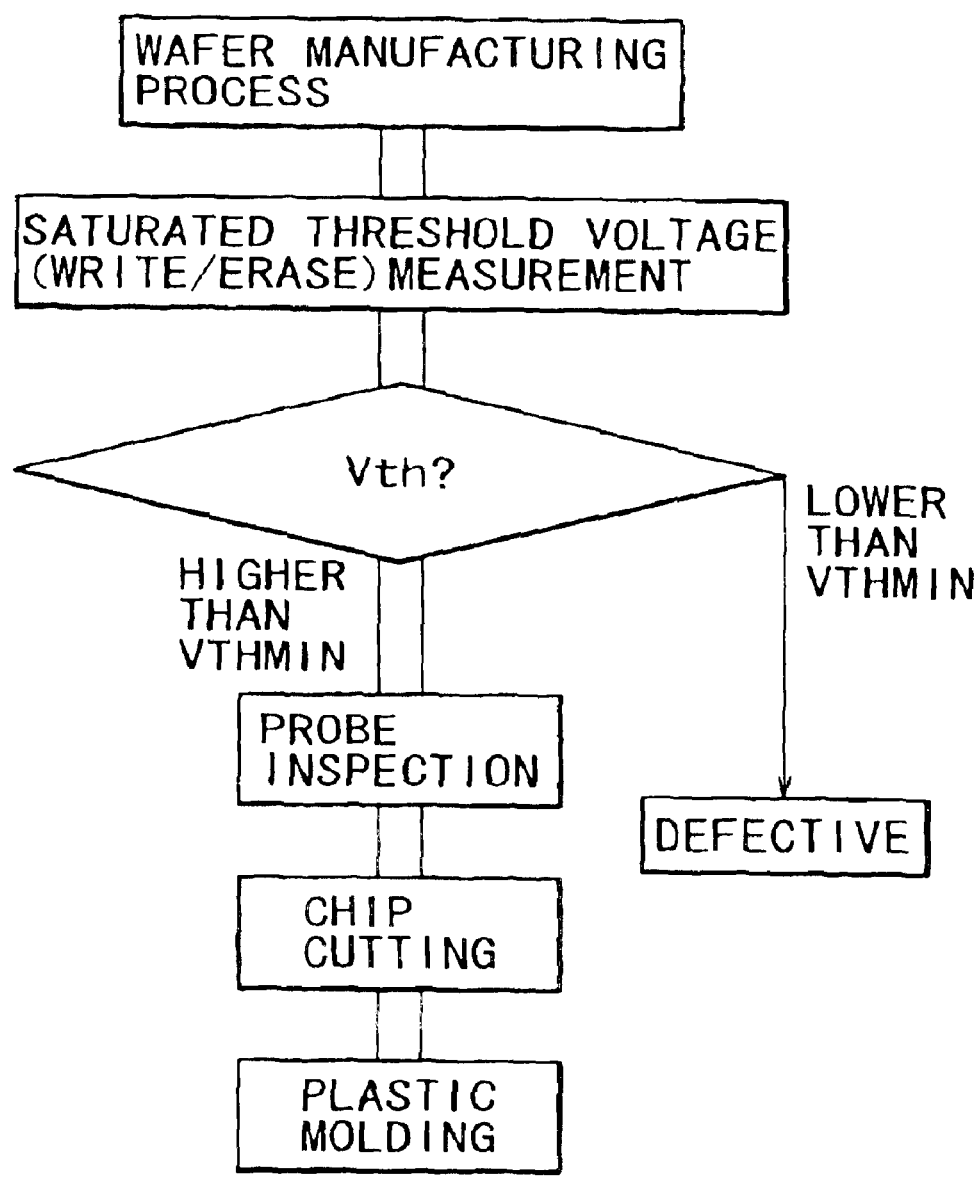
FIG. 5 is a production line flowchart of a nonvolatile semiconductor device manufacturing method to which the inter-layer dielectric film QC (quality control) method of the present invention is applied.

FIG. 5 is a flowchart showing the process to be performed on wafers in the production line using the critical threshold voltage for screening. When the wafers go through a wafer manufacturing process, their saturated threshold voltages are measured. The quality can be assured over a wider area when multiple points on the wafers are measured. However, the intended purpose can be achieved by measuring only one central point on the wafers. A write operation (electron injection from substrate to floating-gate electrode) is performed on each wafer to measure the saturated threshold voltage. Wafers whose measured saturated threshold voltages are lower than the critical threshold voltage for screening are removed from the production line. The remaining wafers are subjected to the subsequent processes. If an erase operation (electron emission from floating-gate electrode to substrate) is performed for measurement purposes, wafers whose measured saturated threshold voltages are higher than the critical threshold voltage for screening are removed from the production line and the remaining wafers are subjected to the subsequent processes. It is necessary to keep in mind that the relationship of the critical threshold voltage for screening to the measured threshold voltage varies depending on whether the write or erase operation is performed for measurement purposes. It is desirable that all the wafers introduced into the production line be subjected to a threshold voltage measurement process for inter-layer dielectric film quality testing. However, the inspection process can be completed, for instance, by measuring every tenth wafer or other specific wafers when it is confirmed that a limited number of wafers are rejected due to a failure to meet the critical threshold voltage requirements for screening.

Figure 14:
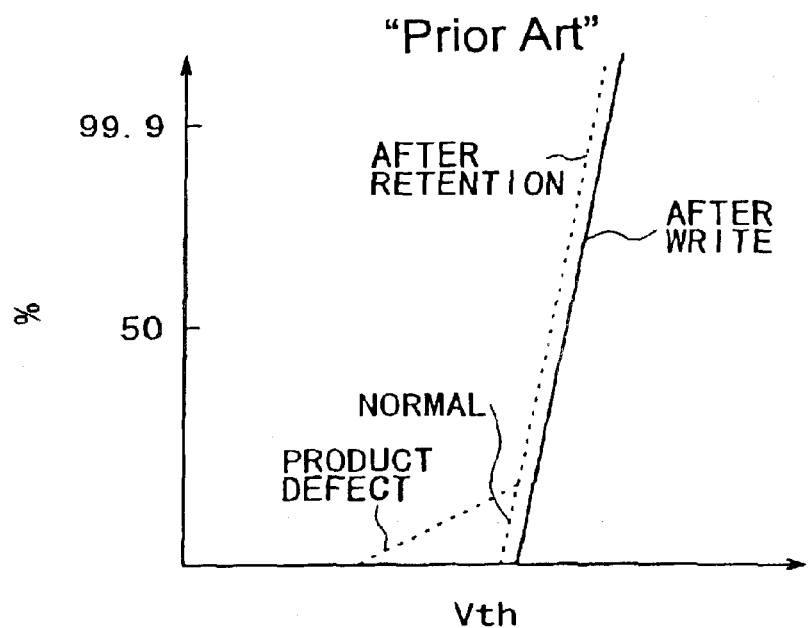
FIG. 14 shows threshold voltage distributions that prevailed before and after a high-temperature retention test, which was conducted after a nonvolatile semiconductor device write (erase) operation.

After completion of the above processes (wafer manufacturing process, threshold voltage measurement process, and nonconforming-wafer removal process), a probe inspection is performed. Under normal conditions, an initial failure test is conducted, without applying any rewrite stress, to check the electrical charge retention characteristic by baking wafers when a write (erase) operation is performed for light injection from substrate. Wafers found to be nondefective are then sliced into chips and then sealed into a package. After completion of assembly, screening is conducted to check whether the chips are defective. Only nondefective chips are then shipped out. FIG. 14 diagrammatically shows the results of an electrical charge retention characteristic test that was conducted at room temperature on manufactured chips picked out after completion of assembly. In the test, the same rewrite stress as in actual operations was applied to packaged manufactured chips to let the floating-gate electrode emit electrons, and electrons were injected from the substrate to the floating-gate electrode so as to obtain a predetermined threshold voltage for the purpose of observing how electrons left the floating-gate electrode. When the chips are normal, the threshold voltage distribution suffers nonrotational displacement or virtually remains still.

Figure 6:
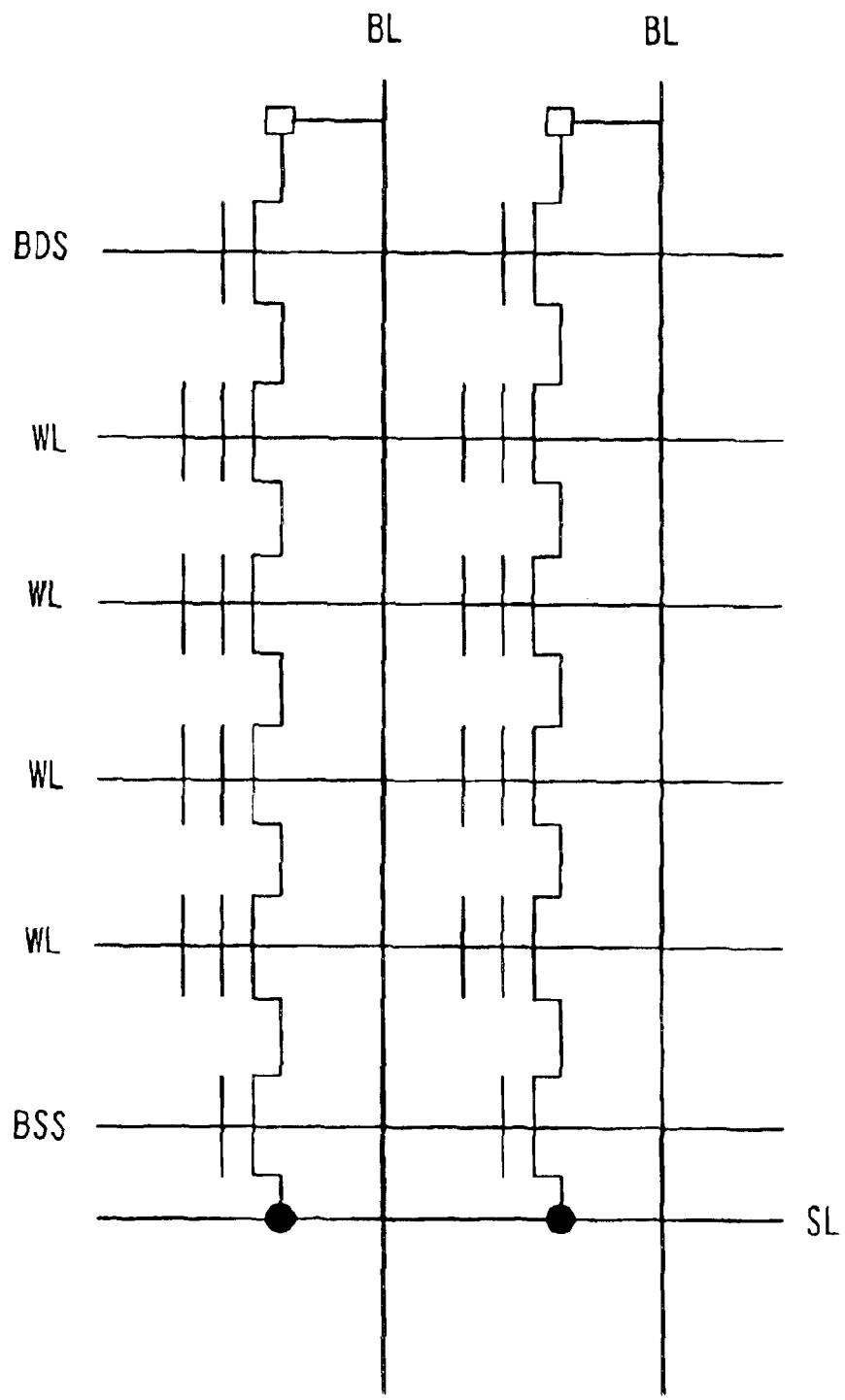
FIG. 6 is an equivalent circuit figure of a NAND flash memory array.

FIG. 6 is an equivalent circuit figure of a NAND flash memory. The source/drain paths of memory cells are series-connected and connected to bit lines (BLs) via a selected transistor whose gate is connected to selection lines BDS and BSS. The NAND flash memory uses a process of electron injection from substrate for write operations and a process of electron emission to substrate for erase operations. Although this NAND method differs from the AND method in the unit of a write operation, it uses a write/erase operation mechanism based on the tunnel current as is the case with the AND method. Therefore, the NAND method can detect inter-layer dielectric leakage by making use of the present invention in the same manner as the AND method. This figure represents another example of an equivalent circuit figure of a nonvolatile semiconductor device memory array that is obtained by exercising inter-layer dielectric quality control, which is an embodiment of the present invention, by means of electron injection from substrate or electron emission to substrate, slicing wafer into chips, and subjecting the chips to plastic molding. When many memories are series-connected, the memory array threshold voltage is determined by the highest threshold voltage. No mater whether inter-layer dielectric leakage occurs during injection or emission, high memory threshold voltages exist at the time of an erase operation and are recognized as an upper-end variation in the threshold voltage distribution after the erase operation.

Figure 7:
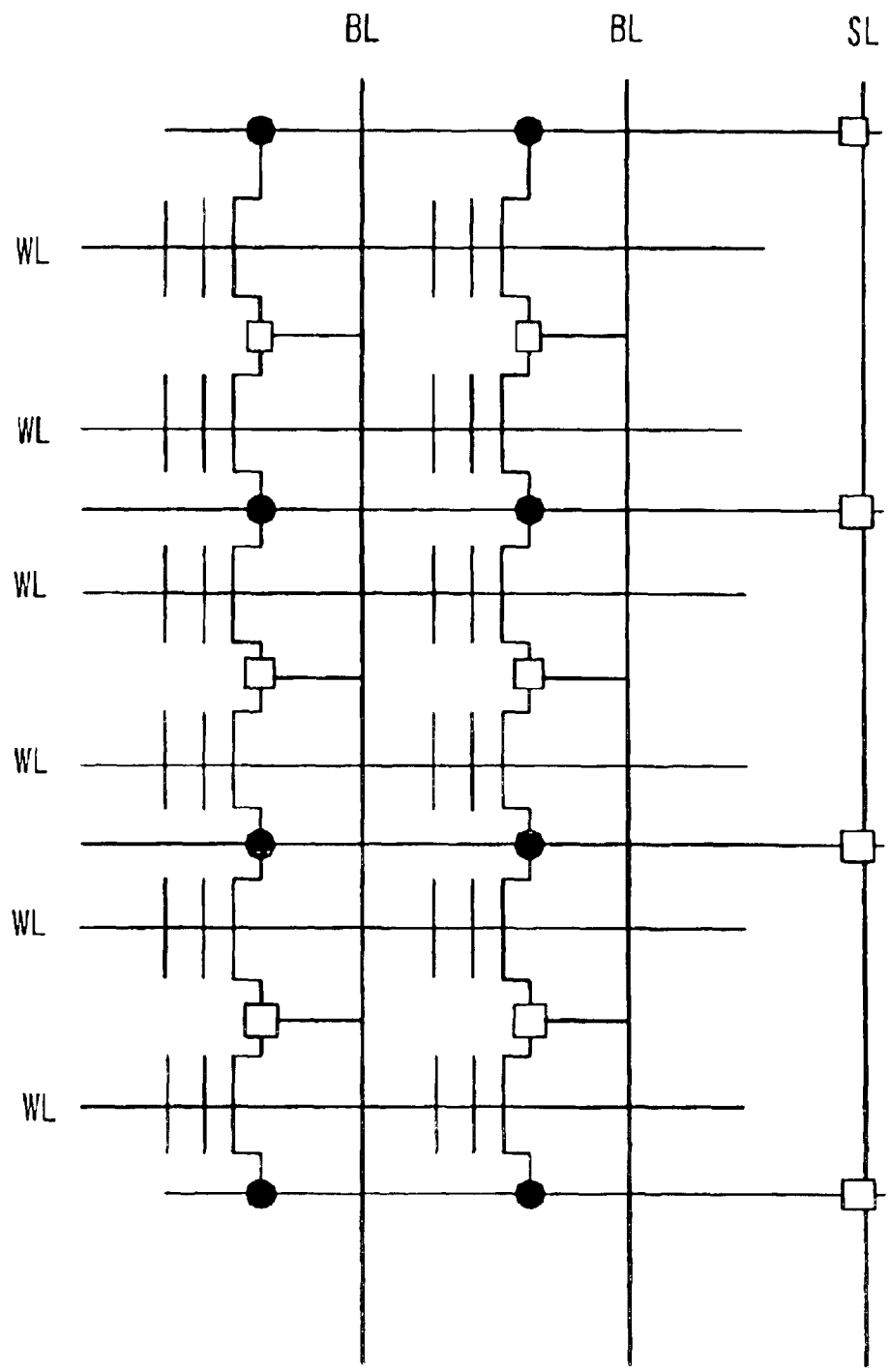
FIG. 7 is an equivalent circuit figure of a NOR flash memory array.

FIG. 7 is a circuit diagram of a NOR flash memory. The circuit configuration for the NOR method differs from that for the AND method in that memory cells are connected to a source line (SL) and data lines (BLs) without being connected to a selected transistor. When the NOR method is employed, write operations are performed by injecting hot electrons into the floating-gate electron and erase operations are performed by emitting electrons from the floating-gate electrode to the substrate. The erase operations performed by the NOR method are based on the tunnel current as is the case with the AND and NAND methods. Therefore, the aforementioned processing scheme can be used to check for inter-layer dielectric leak failures before manufacturing a semiconductor memory device. More specifically, it is possible to determine the nondefective product threshold voltage to be obtained and ship the memories on wafers conforming to the threshold voltage requirements as nondefective articles by measuring the saturated threshold voltage of each process/device structure and measuring the saturated threshold voltage before and after retention. On the other hand, the write operations performed by the NOR method do not use the tunnel current but are based on hot electron injection. Therefore, the voltage applied is low and the electric field formed for the inter-layer dielectric is weak. Consequently, the aforementioned inspection process cannot sort out nondefective articles by performing write operations. However, inter-layer dielectric quality control, which is an embodiment of the present invention, can be exercised by conducting erase operations. The reason is that the erase memory threshold voltage remarkably increases from the normal level when inter-layer dielectric leakage is invoked by an erase operation.

Figure 8:
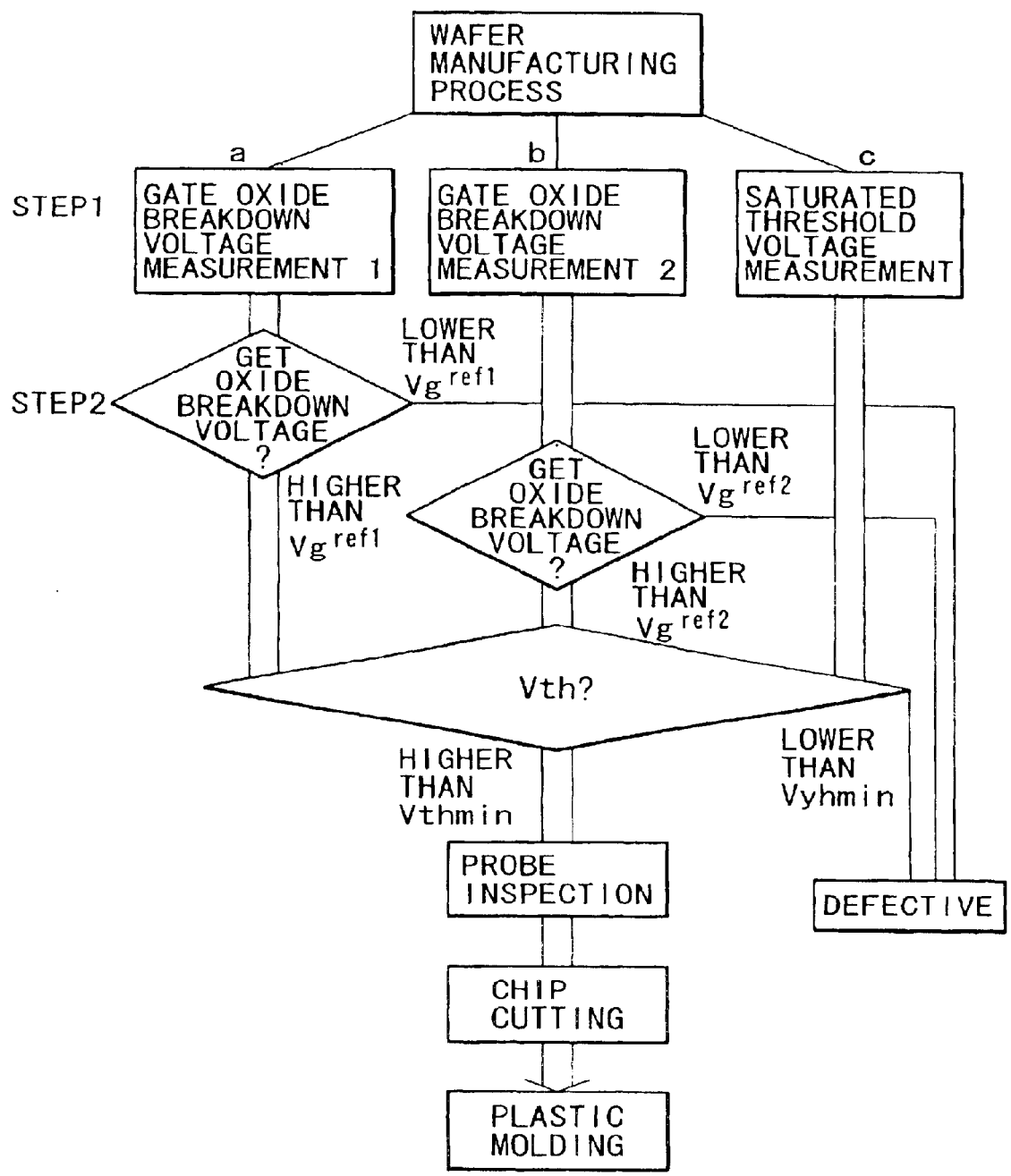
FIG. 8 is a flowchart of a nonvolatile semiconductor device manufacturing method to which a capacitor breakdown voltage and inter-layer dielectric film QC (quality control) method of the present invention are applied.
Figure 12:
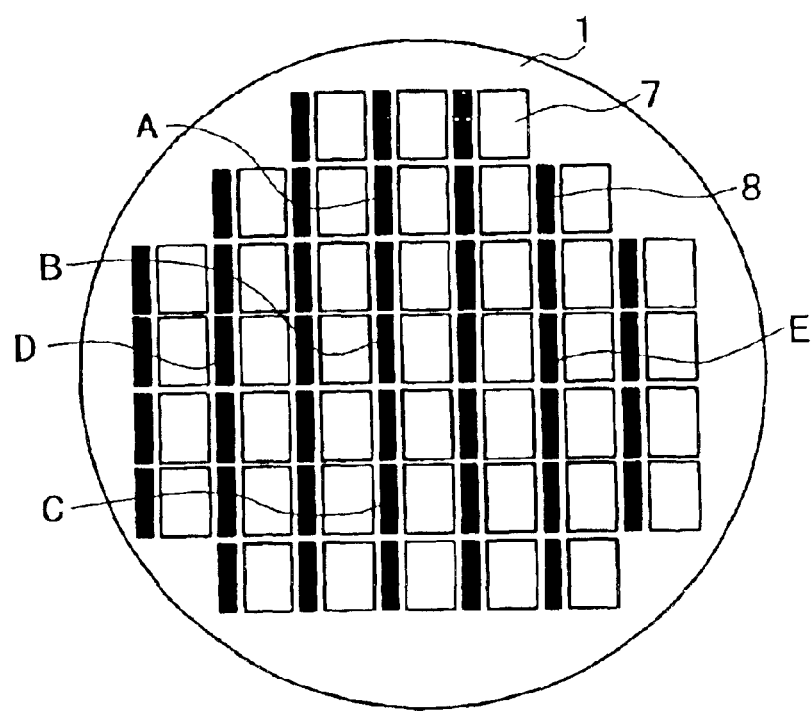
FIG. 12 is a diagram showing chips on a wafer and a test pattern formulated in the scribe area.
Figure 13:
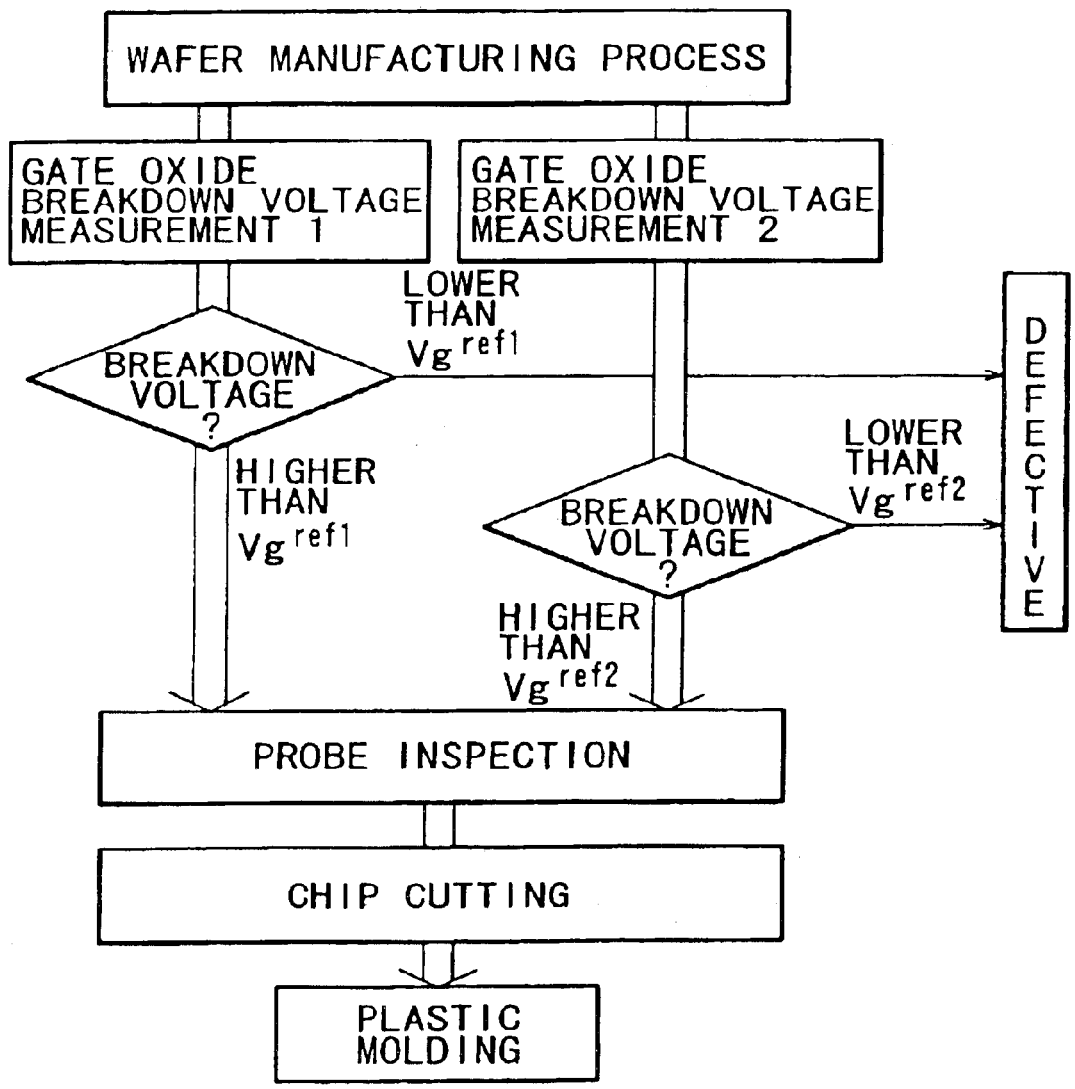
FIG. 13 is a flowchart of a nonvolatile semiconductor device manufacturing method to which a conventional tunnel oxide and inter-layer dielectric film QC (quality control) method are applied.

FIG. 8 is a flowchart showing the combination of conventional capacitor breakdown voltage control and inter-layer dielectric quality control based on electron injection from substrate (inter-layer dielectric QC1), which is an embodiment of the present invention. The same procedure is used even when conventional capacitor breakdown voltage control is combined with inter-layer dielectric quality control based on electron emission to substrate (inter-layer dielectric QC2). For wafers derived from a manufacturing process, a capacitor formed in the scribe area is used to make tunnel oxide/inter-layer dielectric breakdown voltage measurements in relation to the current-voltage characteristic (step 1). A simple capacitor is provided beforehand in the scribe area during a wafer manufacturing process so that the tunnel oxide and inter-layer dielectric can be evaluated separately. Measurements are taken at one or more locations. If measurements are not taken at all locations, it is desirable that measurements be taken, for instance, at nonadjacent upper/lower/left/right locations (A, B, C, D, and E in FIG. 12) to provide dielectric strength assurance over a wide area of a wafer. As regards the tunnel oxide, the current-voltage characteristic prevailing between the substrate and floating-gate electrode is measured to determine the breakdown voltage. For the inter-layer dielectric, the current-voltage characteristic prevailing between the floating-gate electrode and control-gate electrode is measured in the same manner to determine the breakdown voltage. For breakdown voltage measurement purposes, a voltage higher than the maximum application voltage for actual memory operations is used in consideration of variations. When the measured voltage is lower than the stipulated breakdown voltage (Vgref1/Vgref2), the associated wafer is classified as defective (step 2). If the write (erase) threshold voltage measured with a single memory formed in the scribe area is lower than the stipulated threshold voltage (Vthmin) (or higher than the threshold voltage in the case of inter-layer dielectric QC2), the associated wafer is removed from the production line because it is highly likely to become defective no matter whether the capacitor breakdown voltage requirements are met. The breakdown voltage measurement process and aforementioned inter-layer dielectric film quality testing process can be simultaneously performed within the same measuring equipment as far as the employed area and TEG differ from those used for the actual product. On the other hand, a voltage breakdown test can be conducted after a tunnel oxide/inter-layer dielectric formation process within a wafer manufacturing process. Therefore, defective wafers can be found early after the tunnel oxide/inter-layer dielectric formation process, metal first layer formation process, or metal third layer formation process or after each of these processes, and removed from the production line to eliminate the necessity of performing unnecessary processes for cost minimization. In addition, the memory cells on the chips do not have to be electrically stressed. After completion of the breakdown voltage measurement process and inter-layer dielectric film quality testing process, wafers remaining in the production line are subjected to probe inspection, chip cutting, and plastic molding.

Figure 15:
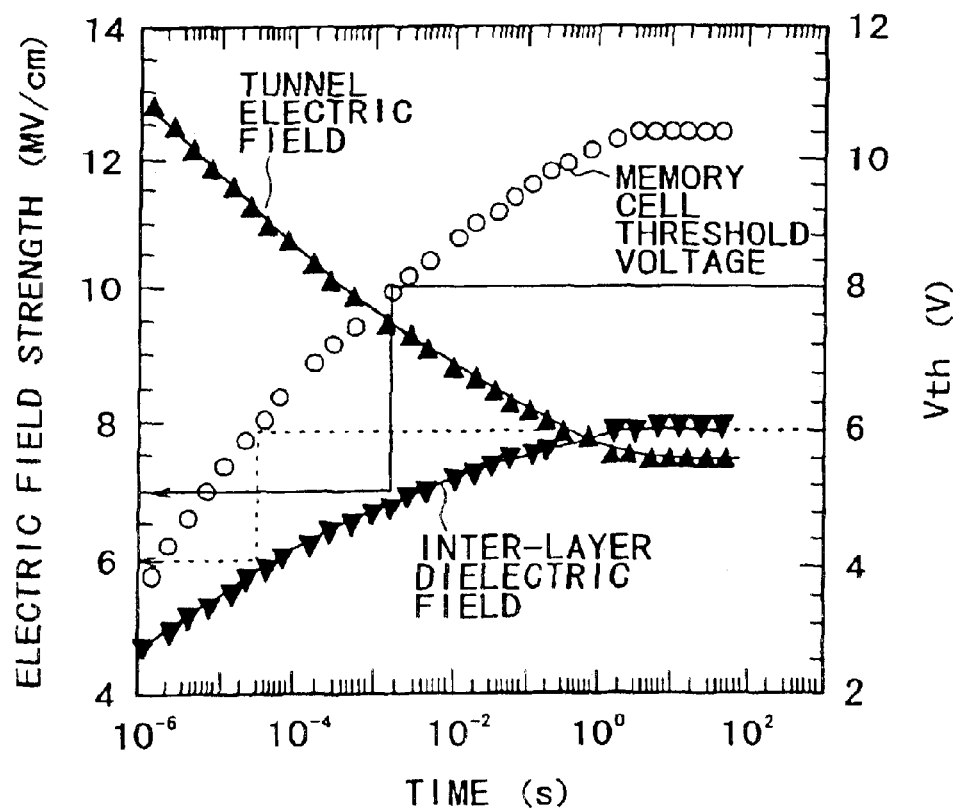
FIG. 15 shows the characteristic of a memory write (erase) operation performed by means of tunnel injection from substrate and the electric field analyses of tunnel oxide and inter-layer dielectric.
Figure 16:
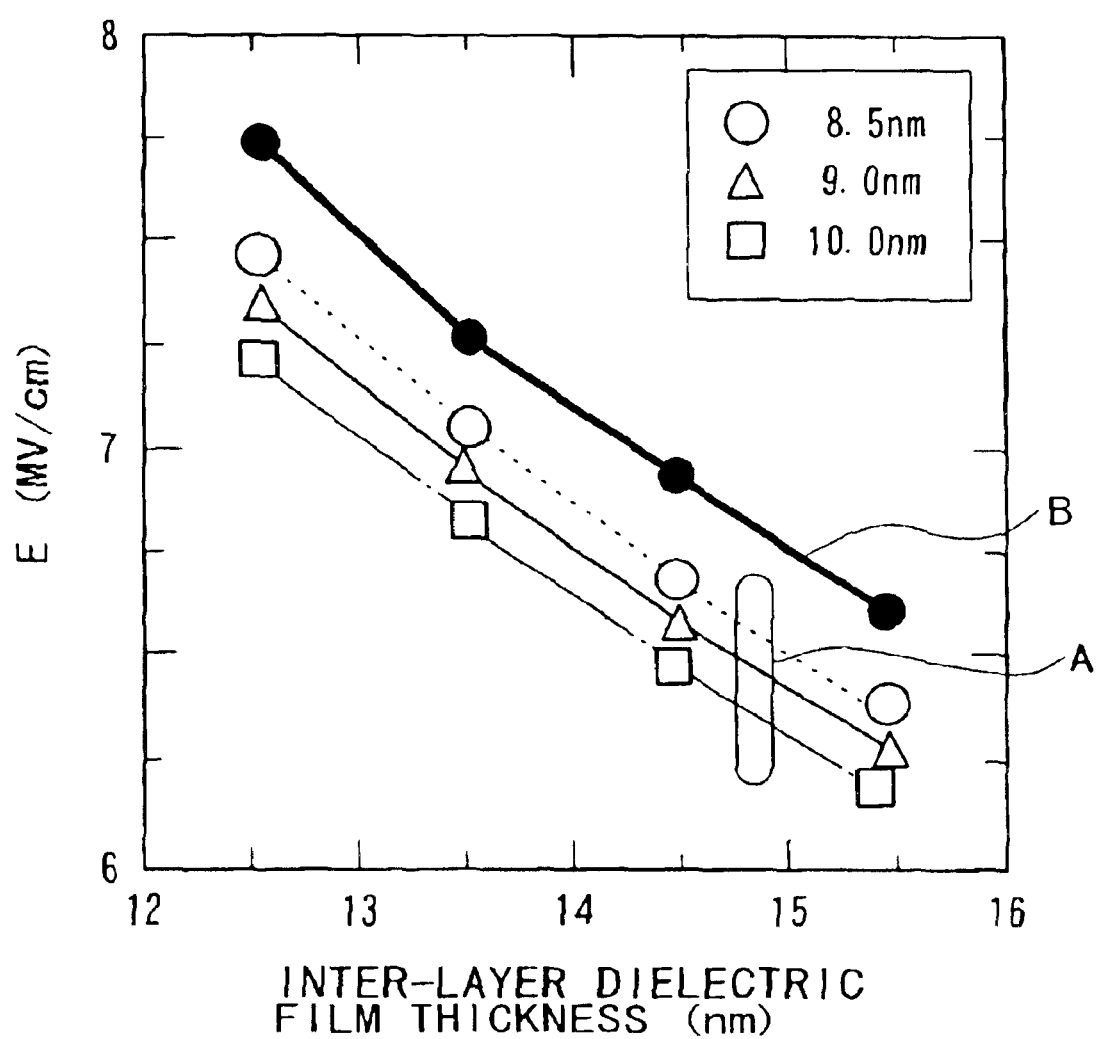
FIG. 16 shows the analyses of the inter-layer dielectric field-to-film thickness relationship prevailing at the time of electron injection from substrate.
Figure 17:
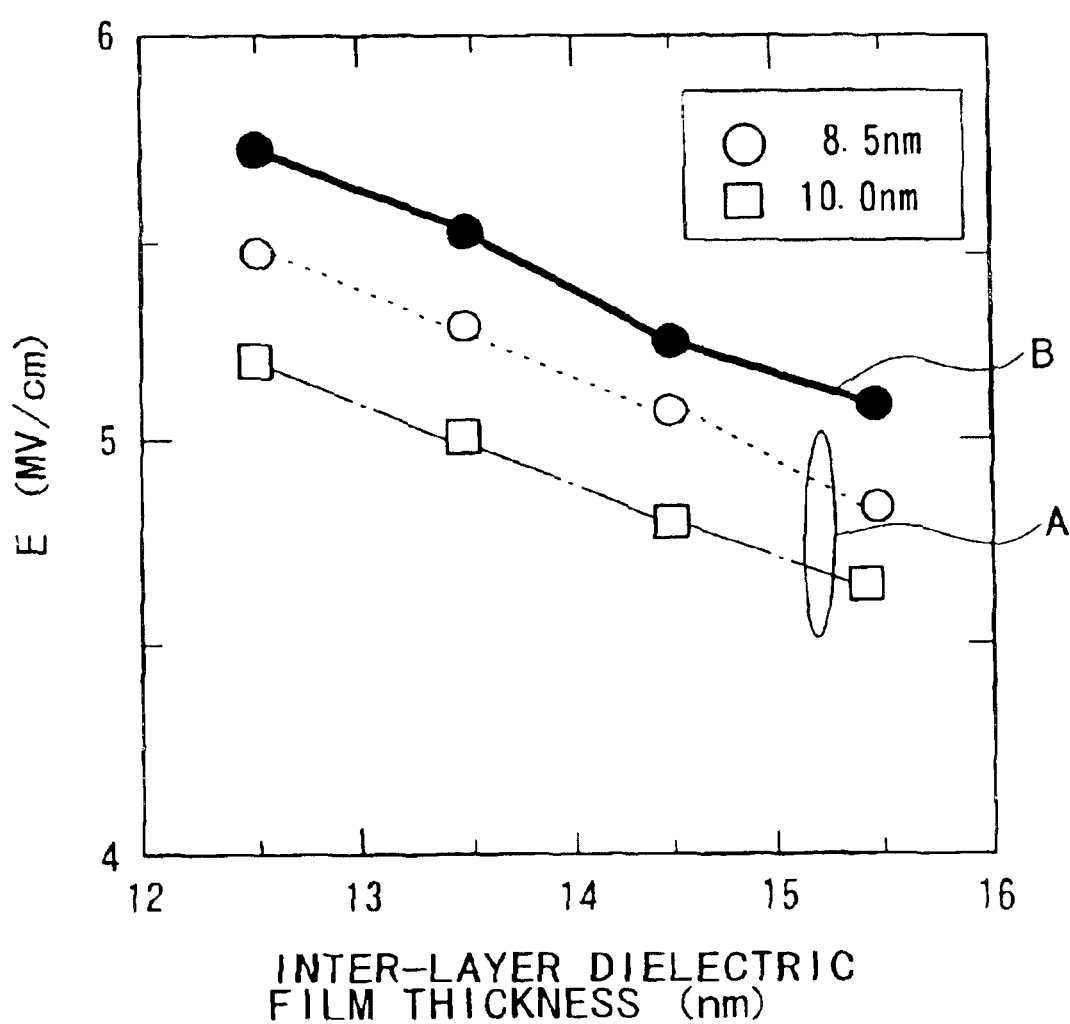
FIG. 17 shows the analyses of the inter-layer dielectric field-to-film thickness relationship prevailing at the time of electron emission to substrate.
Figure 18:
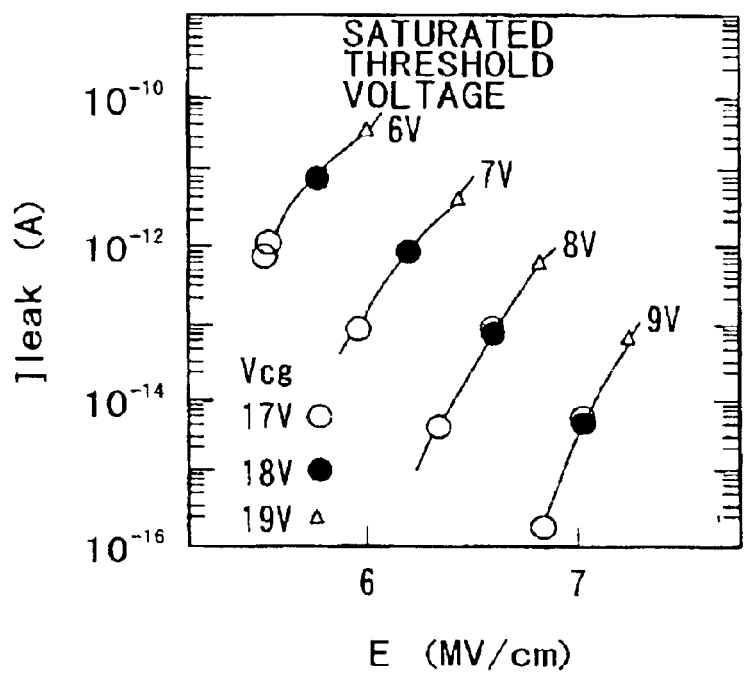
FIG. 18 shows the analyses of the relationship between inter-layer dielectric leak current and electric field.
Figure 19:
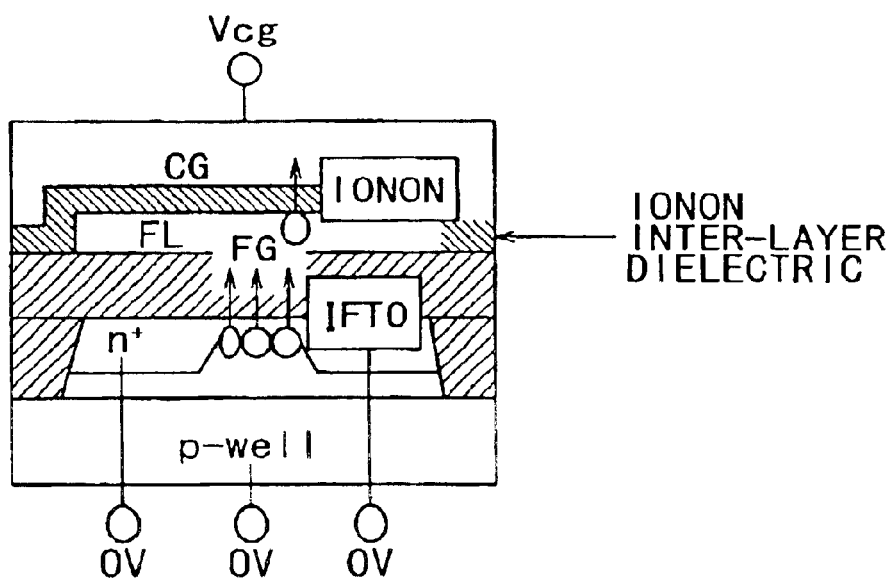
FIG. 19 is a diagram showing how electrons flow when they are injected from a substrate.

Meanwhile, the multi-level programming technology is now important for cost reduction. The nonvolatile memory's electrical charge retention characteristic needs to be such that various threshold voltages remain within a certain distribution and that no distributions overlap with each other during a long retention period. In multi-level programming in which multiple threshold voltages are set, the window has to be larger than in binary storage so that inter-layer film quality testing according to the present invention is extremely important. Since the memory threshold voltage depends on the amount of electrical charge retained in the floating-gate electrode, the strength of electric field applied to the tunnel oxide and inter-layer dielectric significantly varies with the threshold voltage. The electric field applied to the tunnel oxide at the time of electrical charge injection decreases in strength with an increase in the amount of electrical charge retained in the floating-gate electrode. However, such an electrical charge increase causes an increase in the strength of electric field applied to the inter-layer dielectric. In multi-level programming, due attention must be paid to an increased electric field strength applied to the inter-layer dielectric. FIG. 15 shows how the electric fields of the tunnel oxide and inter-layer dielectric change with respect to pulse application time in situations where the tunnel oxide and inter-layer dielectric film thicknesses are 9 nm and 14 nm, respectively. For example, when the memory threshold voltage is 6 V, the electric field strength of inter-layer dielectric of 6 MV/cm. However, when the threshold voltage is set at 8 V on the presumption that the window is enlarged, the strength of electric field applied to the inter-layer dielectric is 7 MV/cm. Since the film used in an actual memory degrades as the memory is repeatedly rewritten, failures occur after write/erase operations. In multi-level programming, a great electric field stress is applied to the inter-layer dielectric particularly when the highest threshold voltage setting is positively higher than the intrinsic threshold voltage. Therefore, there is a demand for an inter-layer dielectric that exhibits long-term reliability against film degradation. Since the present invention provides a means of evaluating the inter-layer dielectric film quality, it is effective not only in binary programming but also in multi-level programming where the film quality is subject to stringent quality control.

The present invention makes it possible to warrant the film quality of inter-layer dielectrics within a wafer using a memory array or a single memory formed in the scribe area of the same wafer. Therefore, no electrical stress needs to be applied to memory cells on chip products to be shipped to customers so that nondefective products can be sorted out without lowering their rewrite dielectric strengths.

The wafer inspection process is described above. Some wafers may be removed from the production line if their measurement results are partially unacceptable. However, if the number of nondefective chips ready for shipment is smaller than that is requested by a customer, it is necessary to obtain additional chips from acceptable portions of wafers removed from the production line. The following screening method can be applied to wafers whose saturated threshold voltage or capacitor breakdown voltage measurements do not met the criteria no matter whether they are subjected to all the stages of a wafer manufacturing process and sliced into chips or rejected as defective articles in the probe inspection process.

FIG. 9 is a flowchart of an inter-layer dielectric screening method 1, which is applied after chip cutting. Voltage application is effected in a DC manner on the presumption that a write (erase) voltage has been applied to an area of memories arrayed on a chip for warranted rewrite cycles. If, for instance, a single write (erase) operation takes 1 ms and 100,000 rewrite cycles are warranted, stress is applied for 100 seconds. Subsequently, an erase operation is performed to expel accumulated electrons from the floating-gate electrode, and then a write (erase) operation is performed at a certain threshold voltage. After the chip under test is allowed to stand at a room temperature for a predetermined period of time, the threshold voltage distribution is checked. If the minimum value of the distribution is below a predefined level, the chip is classified as defective. If electron injection is used for erase operations, the same method as above can be applied with the terms "write" and "erase" interchanged to conduct inter-layer dielectric screening on an individual chip basis.

Figure 10:
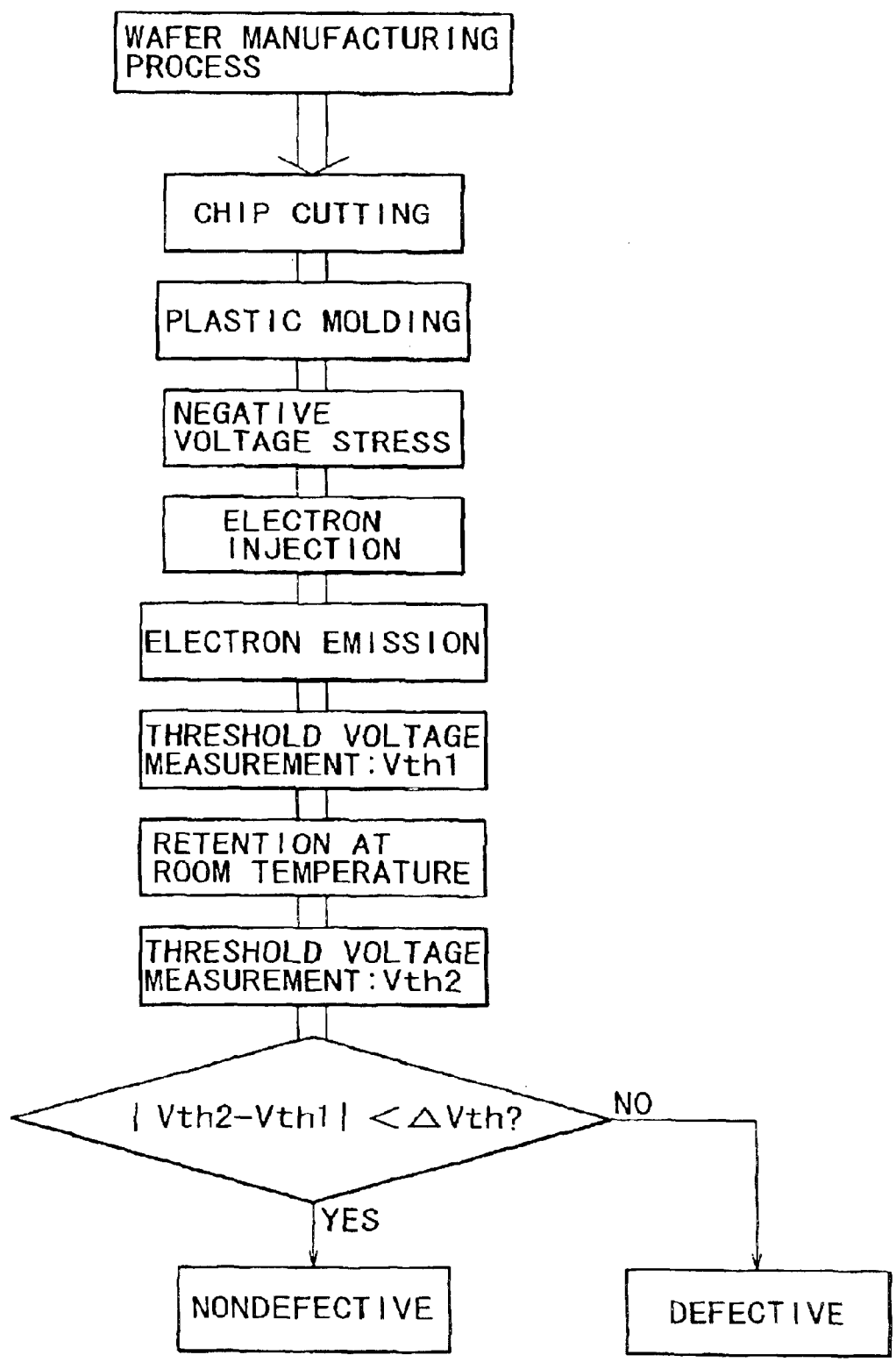
FIG. 10 is a flowchart of an inter-layer dielectric screening method 2 of the present invention, which is applied on an individual chip basis.

FIG. 10 is a flowchart of an inter-layer dielectric screening method 2, which is applied after chip cutting. Voltage application is effected in a DC manner on the presumption that an erase (write) voltage has been applied to an area of memories arrayed on a chip for warranted write cycles. If, for instance, a single erase (write) operation takes 1 ms and 100,000 rewrite cycles are warranted, stress is applied for 100 seconds. Subsequently, a write operation and an erase operation are performed in order named (an erase operation and a write operation are performed in order named). If electron emission is used for write operations, the same method as above can be applied with the terms "write" and "erase" interchanged to conduct inter-layer dielectric screening on an individual chip basis. After the chip under test is allowed to stand at a room temperature for a predetermined period of time, the threshold voltage distribution is checked. If the maximum value of the distribution is above a predefined level, the chip is classified as defective.

In the above explanation, the flash memory is cited as an embodiment of the present invention. However, the semiconductor device manufacturing method incorporating the testing processes stated above is also effective for EPROMs and other nonvolatile semiconductor memories having a double-layer gate structure.

According to the present invention, a nonvolatile semiconductor device manufacturing method containing a memory cell inter-layer dielectric film quality control method based on short-term, simple measurements can be offered, without stressing nondefective memory cells, by using a memory array or a single memory in the scribe area that is formed by the same process and affected by the same process damage as for chip products. After chip cutting, inter-layer dielectric screen can also be conducted on an individual chip basis.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of manufacturing a semiconductor device, comprising:

forming nonvolatile semiconductor memories whose memory cells have respectively a double-layer gate structure having a floating gate and a control gate on a semiconductor wafer;

selecting a plurality of memory cells for test;

applying, for a first period of time, a predetermined voltage to the control gate electrode of each of said memory cells for test in a pulsed manner or a DC manner for continuous write operations without erase operations;

measuring a first memory threshold voltage of the floating gate electrode of each of said memory cells for test;

leaving said memory cells for test as is with no applied voltage during a second period of time;

measuring a second memory threshold voltage of the floating gate electrode of each of said memory cells for test so as to obtain a memory threshold voltage variation from the first memory threshold voltage after said second period of time;

determining, for each of said memory cells for test that has not obtained a saturated threshold voltage, a lower limit of the memory threshold voltage, the lower limit of the memory threshold voltage being derived from measurements of said second memory threshold voltage which have an approximately zero memory threshold voltage variation;

measuring the first memory threshold voltage of respective memory cells having said double-layer gate structure formed on manufactured semiconductor wafers in a manufacturing process; and judging semiconductor wafers carrying memory cells whose measured first threshold voltages are not lower than said lower limit of memory threshold voltage to be nondefective.

2. A method of manufacturing a semiconductor device, comprising:

forming nonvolatile semiconductor memories whose memory cells have respectively a double-layer gate structure having a floating gate and a control gate on a semiconductor wafer;

selecting a plurality of memory cells for test;

applying, for a first period of time, a predetermined voltage to the control gate electrode of each of said memory cells for test in a pulsed manner or a DC manner for continuous erase operations without write operations;

measuring a first memory threshold voltage of the floating gate electrode of each of said memory cells for test;

leaving said memory cells for test as is with no applied voltage during a second period of time;

measuring a second memory threshold voltage of the floating gate electrode of each of said memory cells for test so as to obtain a memory threshold voltage variation from the first memory threshold voltage after said second period of time;

determining, for each of said memory cells for test that has not obtained a saturated threshold voltage, a higher limit of the memory threshold voltage, the higher limit of the memory threshold voltage being derived from measurements of said second memory threshold voltage which have an approximately zero memory threshold voltage variation;

measuring the first memory threshold voltage of respective memory cells having said double-layer gate structure formed on manufactured semiconductor wafers in a manufacturing process; and judging semiconductor wafers carrying memory cells whose measured first threshold voltages are not higher than said higher limit of memory threshold voltage to be nondefective.

3. The method of manufacturing a semiconductor device according to claim 1, wherein the first period of time is determined by multiplying an actual write time by a warranted rewrite cycle count.

4. The method of manufacturing a semiconductor device according to claim 2, wherein the first period of time is determined by multiplying an actual erase time by a warranted rewrite cycle count.

5. The method of manufacturing a semiconductor device according to claim 1, wherein the lower limit of the memory threshold voltage is determined according to a circuit operation margin and a process variation margin.

6. The method of manufacturing a semiconductor device according to claim 2, wherein the higher limit of the memory threshold voltage is determined according to a circuit operation margin and a process variation margin.

* * * * *